United States Patent

Woolley

[11] Patent Number: 5,804,965
[45] Date of Patent: Sep. 8, 1998

[54] METHOD AND APPARATUS FOR STEADY-STATE MAGNETIC MEASUREMENT OF POLOIDAL MAGNETIC FIELD NEAR A TOKAMAK PLASMA

[75] Inventor: Robert D. Woolley, Hillsborough, N.J.

[73] Assignee: The United States of America as represented by the United States Department of Energy, Washington, D.C.

[21] Appl. No.: 718,830

[22] Filed: Sep. 24, 1996

Related U.S. Application Data

[60] Provisional application No. 60/004,222, Sep. 25, 1995.
[51] Int. Cl.[6] .................................................. G01R 33/02
[52] U.S. Cl. ...................... 324/244; 324/258; 324/260; 376/142; 376/143
[58] Field of Search ............................ 324/244, 96, 209, 324/258, 260; 376/133, 142–145

[56] References Cited

U.S. PATENT DOCUMENTS

| | | | |
|---|---|---|---|
| 4,292,124 | 9/1981 | Fisch | 176/3 |
| 4,305,785 | 12/1981 | Praeg | 324/244 |
| 4,827,236 | 5/1989 | Sestero | 335/299 |

Primary Examiner—Sandra L. O'Shea
Assistant Examiner—Jay M. Patidar
Attorney, Agent, or Firm—Mark P. Dvorscak; Robert J. Fisher; William R. Moser

[57] ABSTRACT

A method and apparatus for the steady-state measurement of poloidal magnetic field near a tokamak plasma, where the tokamak is configured with respect to a cylindrical coordinate system having z, phi (toroidal), and r axes. The method is based on combining the two magnetic field principles of induction and torque. The apparatus includes a rotor assembly having a pair of inductive magnetic field pickup coils which are concentrically mounted, orthogonally oriented in the r and z directions, and coupled to remotely located electronics which include electronic integrators for determining magnetic field changes. The rotor assembly includes an axle oriented in the toroidal direction, with the axle mounted on pivot support brackets which in turn are mounted on a baseplate. First and second springs are located between the baseplate and the rotor assembly restricting rotation of the rotor assembly about its axle, the second spring providing a constant tensile preload in the first spring. A strain gauge is mounted on the first spring, and electronic means to continually monitor strain gauge resistance variations is provided. Electronic means for providing a known current pulse waveform to be periodically injected into each coil to create a time-varying torque on the rotor assembly in the toroidal direction causes mechanical strain variations proportional to the torque in the mounting means and springs so that strain gauge measurement of the variation provides periodic magnetic field measurements independent of the magnetic field measured by the electronic integrators.

11 Claims, 7 Drawing Sheets

5,804,965

METHOD AND APPARATUS FOR STEADY-STATE MAGNETIC MEASUREMENT OF POLOIDAL MAGNETIC FIELD NEAR A TOKAMAK PLASMA

CONTRACTUAL ORIGIN OF THE INVENTION

The United States government has rights in this invention pursuant to Contract No. DE-AC02-76CH03073 between the U.S. Department of Energy and Princeton University.

BACKGROUND OF THE INVENTION

This invention relates generally to the measurement of magnetic field. Specifically, it provides a method and apparatus to measure poloidal magnetic field in the vicinity of a tokamak plasma, accurate from steady-state (dc) to several kilohertz. The invention can be used for the real time feedback control of the plasma current, plasma position, and plasma shape in a long-pulse tokamak or steady-state tokamak, either for magnetic fusion research or for power production.

In thermonuclear fusion research, experimental tokamak plasma devices have recently succeeded in magnetically confining plasmas for temperatures and pressures that are within the range required for fusion power reactors. So far, all large tokamak experiments have been pulsed, with pulse durations ranging from less than one second to a maximum of one minute. A task now confronting fusion researchers is to further extend tokamak operation to ultra-long pulse durations (e.g., 15 minutes, several hours, several days or weeks) and ultimately to develop tokamaks capable of true steady state plasma operation for fusion power production. One of the obstacles to overcome for true steady state operation is the inadequacy of the magnetic field sensing methods conventionally employed in tokamaks as part of their plasma control systems.

Feedback control of tokamak plasma position, shape, and current requires real time measurements of the poloidal components of magnetic field at various spatial locations distributed near the plasma. Although conventional field measurement practice has been highly successful for previous and existing short-duration (pulsed) tokamak experiments, it will not be adequate for future steady-state operations of tokamaks. A new method is needed which directly measures the field components rather than measuring only their time rate of change. Conventional field measurement practice employs small air-core electrical coils located near the plasma boundary to sense changes in magnetic field (based on physical principles of magnetic induction). Typically many such coils (e.g. 52 for TFTR) are mounted on the vacuum vessel in a single poloidal plane (i.e., a plane including the tokamak's center line axis of symmetry), thus surrounding the plasma with a ring of discrete field sensors, as depicted in FIG. 1. These conventional poloidal field measurements are typically used for the feedback control of plasma position and plasma shape.

To understand both conventional practice and the new aspects of this invention, it is useful to define the following vector associated with the geometry of any air-core electrical coil winding:

$$\vec{S} = \oint \vec{x}(l) \times d\vec{x}(l) \tag{1}$$

where x(l) is the vector location of the coil winding wire expressed parametrically as a function of distance along the wire, l, and the integration is along the entire winding loop. This vector S has the dimensions of a surface area. For a planar coil winding loop, S is oriented perpendicular to the winding plane and has a magnitude equal to the product of the winding loop's enclosed surface area multiplied by the number of winding turns:

$$\vec{S} = NA \tag{2}$$

Magnetic induction produces the following voltage in any nonmoving (fixed) coil winding connected to an electrical load with negligible admittance:

$$V = S \cdot \frac{dB}{dt} \tag{3}$$

where B is the magnetic field vector at the coil location (assumed to be approximately uniform throughout the coil, which is valid for a physically small coil), and · is the vector dot product operation.

At each location chosen for poloidal field measurement, conventional practice uses two coils oriented so that their S vectors are orthogonal to each other and are contained in the poloidal plane. Their S vectors are frequently oriented directly in the "r" and "z" directions in order to be directly sensitive to those components of magnetic field; the coils are then typically called $B_r$ & $B_z$ coils. They may alternatively be oriented in a different pair of orthogonal directions in the poloidal plane without affecting the validity of the following descriptions or of this invention. For example, on the TFTR the $B_p$ & $B_\theta$ coils are mounted on a circle surrounding the plasma and are oriented in radial/tangential directions with respect to that circle. If oriented in the "r" and "z" directions, integrating over time gives:

$$B_r(t) = B_r(0) + \left(\frac{1}{N_r A_r}\right) \int_{S=0}^{S=t} V_r(s)\,ds \tag{4}$$

$$B_z(t) = B_z(0) + \left(\frac{1}{N_z A_z}\right) \int_{S=0}^{S=t} V_z(s)\,ds$$

Conventional practice is to connect the output voltages from these $B_r$ & $B_z$ coils as input signals to electronic integrators which are initially reset before a pulsed tokamak experiment begins, when the poloidal field at each coil is known to be zero. Subsequent outputs from the electronic integrators are proportional to magnetic field. These conventional integrated induced voltage measurements of poloidal magnetic field are typically used as feedback signals by the plasma control system throughout the plasma experiment duration.

However, nonideal effects in any practical electronic integrator allow its output to deviate from the ideal integrator output by a growing error. This error can only be bounded by limiting the total integration time duration. Improving integrator technology can increase that time duration, but cannot extend field measurement accuracy to true steady state (dc) operation.

Thus, true steady state tokamak operation using only conventional inductive magnetic field measurement methods for plasma control is known to be impossible. If magnetic field measurements are to be relied on for the steady state feedback control of plasma position, shape, and current, then steady-state (dc) measurement accuracy must somehow be achieved.

It should be noted that the plasma current can be determined to high accuracy by simply forming an appropriate linear combination of signals from the many discrete $B_r$ & $B_z$ coil surrounding the plasma. In conventional tokamak practice it is instead traditional to use a large, spatially distributed "Rogowski coil" winding which encloses the plasma current, and which has a special geometric shape designed so that the voltage induced in it is proportional to the line integral of the time-rate-of-change of magnetic field, i.e., $$V \propto \oint \frac{dB(l)}{dt} \cdot d(x(l)) \tag{5}$$

where here x(l) represents the path enclosing the plasma current. This induced voltage is conventionally connected to drive an electronic integrator which is reset prior to a pulse (when the plasma current is known to be zero). The integrator output is then proportional to the total enclosed plasma current because of the basic field theory formula:

$$I_P = \frac{1}{\mu_0} \oint B(l) \cdot d(x(l)) \tag{6}$$

However, this last integral could alternatively be approximated as the weighted sum:

$$I_P \approx \frac{1}{\mu_0} \sum_k B(x_k) \cdot \Delta(x_k) \tag{7}$$

where the magnetic field vectors at each location, $B(x_k)$, would be measured from the conventional $B_r$ & $B_z$ coils and their electronics. Thus, plasma current could be measured for feedback control purposes in conventional short-pulse tokamaks using only the conventional $B_r$ & $B_z$ system and dispensing with the Rogowski coil altogether. Therefore it is not necessary to upgrade the Rogowski coil to true steady state operation. Upgrading the $B_r$ & $B_z$ coils to true steady state operation would suffice, as long as a large number of such upgraded sensors would still fit in a poloidal plane around the plasma.

It is therefore a principal object of the present invention to provide a method and apparatus for measuring poloidal magnetic field in the vicinity of a true-steady-state tokamak plasma (i.e., with no limit on time duration), with measurement accuracy over the frequency spectrum from dc to several kilohertz maintained sufficiently precise for all time that it can be reliably used for the steady-state feedback control of plasma boundary shape, plasma position, and plasma current.

It is an additional object of the present invention that the measurement method be based only on simple physical electromagnetic principles so that measurement calibrations do not significantly change due to temperature or other variable phenomena unrelated to magnetic fields.

A further object of the present invention is to provide these field measurements, which are accurate for unlimited time durations, without increasing the physical space required near the plasma for each discrete sensor location beyond that normally required for conventional short-pulse-duration tokamak practice; without increasing the sensitivity, either of the measurement accuracy or of sensor survival, to neutron or gamma irradiation or temperature excursions, beyond the sensitivity normally associated with conventional short-pulse-duration tokamak practice; and, without significantly increasing measurement system cost beyond that required for conventional short-pulse-duration tokamak practice.

SUMMARY OF THE INVENTION

An apparatus for steady-state magnetic measurement of poloidal magnetic field near a tokamak plasma, where the tokamak is configured with respect to a cylindrical coordinate system having z, phi (toroidal), and r axes, can include a rotor assembly having a pair of inductive poloidal field pickup coils coupled to electronic integrators for measuring magnetic field changes in the plasma. These coils are concentrically mounted on an axle, and the axle is oriented on the tokamak to point in the toroidal direction. The coils and axle are mounted on a baseplate. First and second springs are located between the baseplate and one of the pickup coils, and the second spring provides a constant tensile preload in the first spring. A means for providing a known current pulse waveform to be periodically injected into each coil is provided so that a torque is created on the rotor assembly in the toroidal direction. This torque is then opposed by the springs such that a strain gauge mounted on one of the springs actually provides a direct measurement of magnetic field changes in the plasma.

The axle is structurally mounted on the baseplate to allow rotation through small angles about the toroidal direction, but rotation or translation in directions other than about the toroidal direction are prevented.

The first spring is a thin, straight strip of metal, having a cross-sectional area so that the maximum toroidal torque on the rotor assembly results in metal stress less than the metal's fatigue stress limit but large enough so that metal strain is capable of being easily measured.

The second spring is a coil and adjusted to always be in compression.

BRIEF DESCRIPTION OF THE DRAWINGS

The above-mentioned and other features of the invention will become more apparent and be best understood, together with the description, by reference to the accompanying drawings, in which.

DETAILED DESCRIPTION OF THE INVENTION

Introduction

Figure 1:
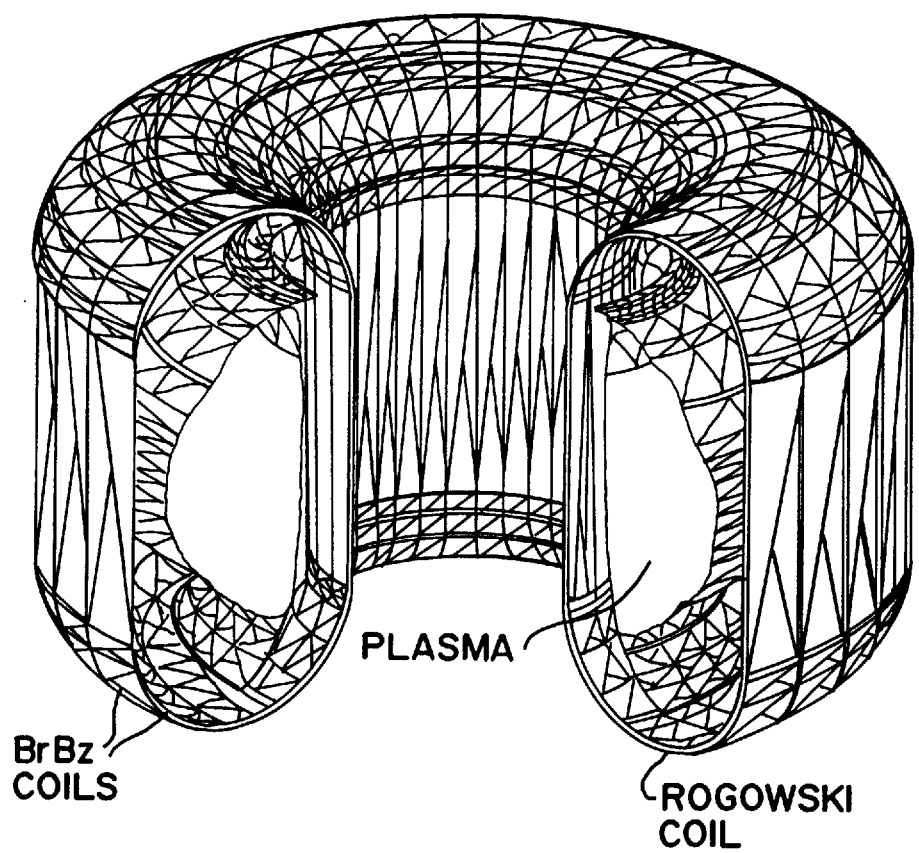
FIG. 1 shows a general arrangement of conventional tokamak magnetic field sensors (prior art)

Current state of the art field measurement practice based on magnetic induction provides continuous output signals measuring poloidal field at each coil location, valid up to several kilohertz and accurate for several seconds of plasma duration. This current practice could still be used for steady state tokamak operation if the electronic integrators were periodically restored to "correct" field values. However, then there would have to be an independent measurement scheme to provide those "correct" poloidal field values at the same set of physical locations where the electrical coils are mounted. The invention described herein is such a scheme, relying on a different physical principle to separately measure field at each coil location on a periodic schedule. Each electronic integrator is then corrected in order to reduce to zero any errors between its continuous output signal based on magnetic induction and the sequence of separate magnetic field measurements.

The new measurement method employed in this invention is based on measuring the mechanical torque exerted on an air-core planar coil conducting electrical current in a magnetic field. It is well known from basic physical principles that this torque is given by the equation:

$$\vec{T} = I\vec{S} \times \vec{B} \tag{8}$$

where I is the electrical current, S is the same geometric vector associated with a coil winding that was defined above, and B is the external magnetic field vector at the coil location, i.e. the field that would exist at that location without any coil current. (Note that the vector IS is called the magnetic moment vector, M in some physics texts.)

If both the $B_r$ and $B_z$ coils for one field measurement location are wound on a common mechanical form, then the total component of mechanical torque on that form about the toroidal axis, $\phi$, is:

$$T_\phi = I_r N_r A_r B_z - I_z N_z A_z B_r \tag{9}$$

With a known current pulse waveform periodically injected into each coil in turn, pulsed torque variations are proportional to the magnetic field and current. This time-varying torque causes mechanical strain variations proportional to the torque in the mounting structure for the coil winding form. Strain gauge measurement of these variations provides periodic magnetic field measurements which are independent of the conventional electronic integrator system.

The novel aspect of this invention is that the coils used for periodic torque measurements to determine magnetic field are identically the same coils that are also used continuously to measure field changes from induced voltage via electronic integrators, i.e., the conventional $B_r$ & $B_z$ coils. External electronics ensures that the two simultaneous measurement processes operate in the same coils without interference. This is possible because the coils are electrically linear components which obey superposition principles and have measurable parameters.

With an injected current pulse, I(t), a coil obeys the electrical circuit equation:

$$V = \dot{\phi} + \dot{I}L + IR \tag{10}$$

where

I and V are current and voltage,

L represents the known inductance,

R represents the imprecisely known resistance, the rate of change of linked external flux is give by:

$$\dot{\phi}_{ext} = N_i A_i \frac{dB_i}{dt} \tag{11}$$

here

N is the number of turns,

A is the area enclosed by each turn and the subscript I denotes either r or z.

Therefore $$B_i(t) = B_i(0) + \frac{1}{N_i A_i} \left[ \int_0^t (V(s) - I_i(s)R_i(s))ds - LI(t) \right] \tag{12}$$

Thus, the conventional induced voltage method can still be used to accurately determine magnetic field even while currents are injected into the measurement coil, by actively subtracting the voltage effects of the injected current.

In order for this invention to function properly and with useful accuracy, various important design constraints must be observed. These constraints are summarized here and are then discussed in more detail.

(1) Each pair of $B_r$ & $B_z$ coils must be packaged together in a concentric fashion. This is important because the roles of the two coils are interchanged between the two measurement techniques, as can be seen by comparing Equation (4) with Equation (9). The mounting orientations of $B_r$ & $B_z$ coils cause them to develop voltages proportional to the rate of change of $B_r$ and $B_z$, respectively. But with those orientations, injected currents cause a torque proportional to $B_r$ in the $B_z$ coil, and cause a torque proportional to $B_z$ in the $B_r$ coil. If a $B_r$ and $B_z$ coil pair were not concentric but were mounted at spatially different locations, the actual poloidal fields would not necessarily be the same at the two locations. Thus, the torque measurements for a coil pair could not be used directly to correct the electronic integrators of that pair without additional measurements.

(2) The mechanical mounting designed for a $B_r$ & $B_z$ coil assembly must react the toroidal component of torque through a single structural member instrumented with a strain-monitoring gauge, and the force in that member should furthermore be insensitive to other components of coil torque or to net coil force. Note that this implies that the $B_r$ & $B_z$ coil assembly must not be "potted".

(3) Heating of $B_r$ & $B_z$ coil assembly windings by periodically injected current pulses must be consistent with temperature limitations of the wire and insulation and with the heat dissipation capabilities of the assembly.

(4) Current pulse waveforms must be functions of time specially shaped so that:
  (a) they do not excite resonant mechanical vibrations of the assembly, and
  (b) magnetic field determination from strain measurements is insensitive to any pre-existing resonant mechanical vibrations.

(5) Current pulses must be injected into each coil from a high impedance driver circuit, so that the coil voltages induced by changes in the external magnetic field are fully observed.

(6) The effects of the voltage pulse waveform, developed in each coil by the coil's known self inductance when the current pulse waveform is injected, must be canceled in real time via signal subtraction to avoid introducing error in the integrated induced voltage determination of magnetic field.

(7) The electronics must track changes in the resistance of each coil circuit (based on coil voltage and current signals), and must use this estimated circuit resistance to synthesize an estimated "IR" resistive voltage drop waveform for each injected current pulse, and must cancel this estimated resistive voltage drop via real time signal subtraction to avoid introducing error in the integrated induced voltage determination of magnetic field.

(8) The electronics must determine the error between the magnetic field as determined from the integrated induced coil voltage and the magnetic field as determined from the measured strain gauge variations during injected current pulses. This sequence of field error values must then be used in the electronics to adjust the induced voltage integrators (perhaps slowly) so that field measurement errors remain acceptably small for unlimited time durations. This achieves true steady-state measurement accuracy.

Particular Aspects

Figure 2:
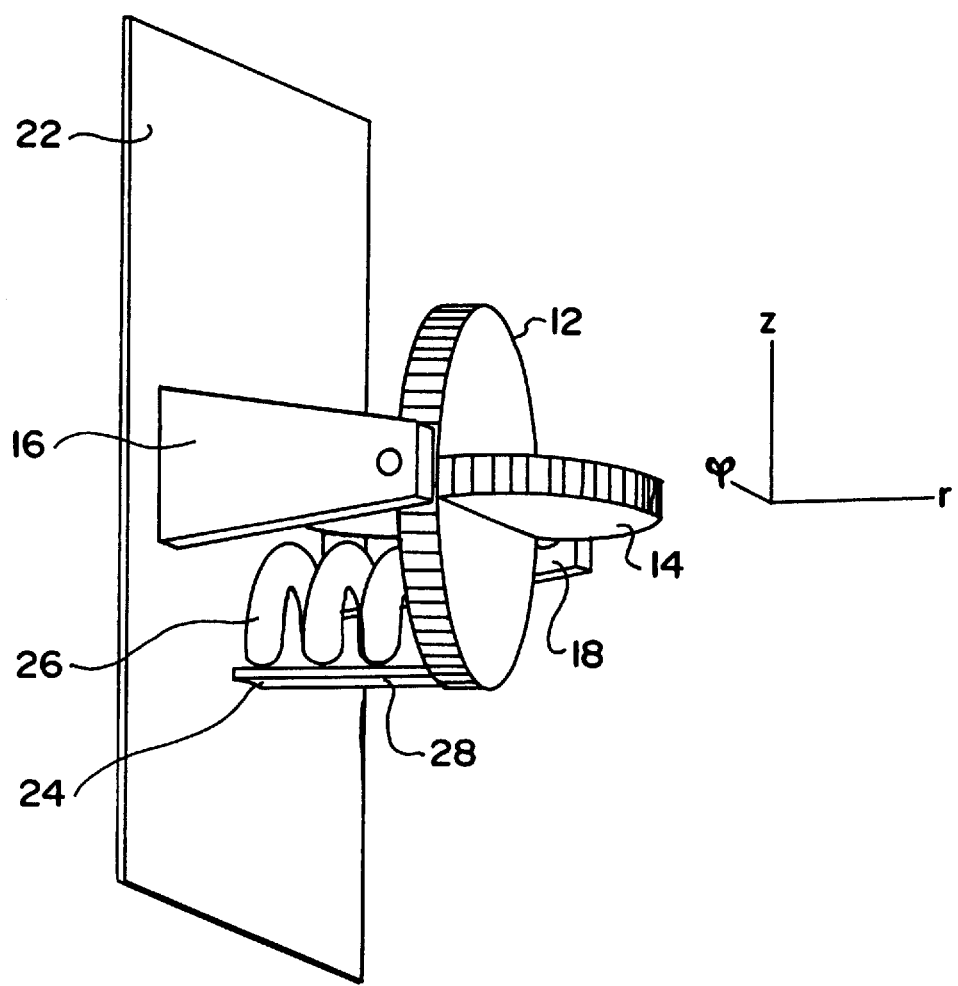
FIG. 2 shows a mechanical arrangement for the steady-state measurement of the poloidal field near a tokamak plasma in accordance with the present invention.

An apparatus 10 for steady-state measurement of the poloidal magnetic field near a tokamak plasma in accordance with the present invention is shown in FIG. 2. As shown in FIG. 2, the apparatus includes coils 12 and 14. The two coils 12 and 14 are oriented in the conventional $B_r B_z$ directions with their axes aligned with the tokamak's local "r" and "z" directions, respectively. They are mounted between two pivot support brackets 16, with their geometric centers at the same location. An axle 18 goes through the geometric centers of the coils 12 and 14, is perpendicular to the "r" and "z" coil axes, and is oriented on the tokamak to point in the toroidal direction. The axle 18 is structurally mounted between the two pivot support brackets 16, which in turn are mounted on a $B_r B_z$ sensor base plate 22. This assembly, consisting of the common form 16, the two coils 12 and 14, and axle 18, will henceforth be called the "rotor assembly" 20, notwithstanding the fact that it is mechanically constrained by mechanical linkage 24 so that its maximum possible rotation is insignificant.

Coil mounting must be sufficiently strong so that the rotor assembly 20 can be considered mechanically to be a rigid body. The center of mass of this rotor assembly is also located at the same geometric center location, and its principal moments of inertia are aligned with the local "r", "z", and "phi" (toroidal) directions. The axle's 18 mounting on the pivot support brackets 16 is in a manner which allows rotation through small angles about its axis with negligible torque, but does not allow rotation about other directions or translation in any direction. This axle mounting can use either low friction sliding bearings or a suitable low torsion spring system. With these geometric constraints, all three components of any rotor force and two of the three components of any rotor torque are entirely transmitted directly through the axle 18 and pivot support brackets 16 to the base plate 22 without involving any other mechanical linkages.

When current is injected into a $B_r$ coil 12, the $B_z$ component of poloidal field causes torque on the rotor assembly 20 about the toroidal direction, and when current is injected into a $B_z$ coil 14, the $B_r$ component of poloidal field also causes a rotor assembly torque in the same direction. However, since this toroidal component of rotor torque is parallel to the axle 18, it is not transmitted through the axle to the base plate. The toroidal torque component is instead opposed by forces perpendicular to the base plate which are developed in the axle restraints and in mechanical linkage devices 24 and 26, as shown in FIG. 2.

Mechanical linkage 24 is a thin straight strip of strong metal (e.g. extra spring temper Beryllium Copper alloy 17400, or stainless steel). In this service it behaves as a very stiff spring. The area of the metal cross section of linkage 24 is restricted so that the maximum expected toroidal torque on the rotor assembly 20 results in metal stress less than the alloy's fatigue stress limit but large enough so that metal strain is significant and easily measured (e.g. strain=0.0005). Strain in linkage 24 is measured with a commercial strain gauge 28 mechanically bonded to the face of linkage 24, by measuring its resistance using a high frequency ac carrier (e.g. 50 khz).

Linkage 26 is a soft spring, adjusted to always be in compression and thus provide a constant tensile preload in the linkage 24. If linkage 26 did not exist, then the force transmitted through linkage 24 would theoretically be equal to the toroidal torque developed in the rotor assembly divided by the perpendicular distance between linkage 24 and the axle 18. Since the toroidal torque can be of either polarity, the force in linkage 24 could be either tensile or compressive. However, since linkage 24 is a thin strip it actually can only transmit tensile forces and would buckle under significant compressive loads. The preload force provided by linkage 26 avoids any buckling in linkage 24. By choosing linkage 26 to be a far softer spring than linkage 24, time varying rotor assembly torques are opposed almost completely by stress changes in linkage 24, with the linkage 26 force remaining essentially constant.

Wires (not shown in FIG. 2) leaving the $B_r B_z$ coils must be mechanically flexible so that they do not divert any torque from the linkage 24. This can be achieved, for example, if the wires exit the rotor assembly 20 and run freely in the toroidal direction before turning toward the baseplate 22 to connect with external terminations located at that point.

Wire feedthroughs are necessary for the two coils 12 and 14, and for the one strain gauge 28. A 2-wire strain gauge interface is sufficiently accurate, or a full 4-wire Kelvin bridge circuit may be used to suppress noise. The feedthrough for one $B_r B_z$ assembly must therefore accommodate either 3 or 4 wire pairs.

Heat transfer from the rotor assembly to the baseplate without excessive temperature rise is an important design consideration. Since electrical current is periodically injected into the $B_r$ and $B_z$ windings, some $I^2R$ heat is generated there and must be transferred out. But because the mechanical mounting design deliberately isolates the rotor assembly 20 from the baseplate 22, this heat cannot easily leave the rotor assembly via conduction through any solid materials. The simplest design solution relies on free convection in trapped air and limits $B_r B_z$ coil heating accordingly. A different design solution that permits higher coil currents fills the space around the rotor assembly with a dielectric heat transfer liquid.

A cover (not shown in FIG. 2) must protect the internal components of the apparatus 10 from the local environment. If the apparatus is to be mounted inside the tokamak's vacuum vessel, then the cover must be sealed in a vacuum-tight fashion so that the air or other fluid needed for internal heat transfer stays trapped inside. The cover must also be strong enough to maintain this seal even with changing internal pressures accompanying temperature excursions.

Discussion of the Current Excitation Waveform

This invention can be practiced using conceptually very simple current excitation waveforms. An example is the use of continuous sine waves of two different frequencies and of precisely controlled amplitudes for the injected currents in the two coils. Then the total torque on the rotor assembly would vary as the sum of the products between each of the two sine waves and the field components $B_r$ and $B_z$, respectively. Considering the Fourier decompositions of $B_r$ and $B_z$ into frequency components, one effect of the multiplication operation inherent in forming these physical torque products is to shift the zero frequency components of $B_r$ and $B_z$ to the frequencies of the excitation current. The mechanical strain response to the total torque then includes sine waves at the two excitation frequencies, whose amplitudes contain information about $B_r$ and $B_z$. The signal processing scheme shown in the diagram of FIG. 4 would use that torque variation information in conjunction with the output of the induced voltage integrators to determine (and correct) any steady-state error in those integrators. Its use of the induced voltage information also eliminates sensitivity to any other frequency components of $B_r$ and $B_z$ (e.g., at twice the current excitation frequencies). However, the use of continuous sine waves would continuously heat the $B_r$ and $B_z$ coil windings, and so the operating current level would have to be restricted in order to avoid excessive coil temperatures. The resulting low levels of operating torque might interfere with overall system sensitivity. It may be possible to achieve a better signal-to-noise ratio, and therefore a better system performance, if current is injected as a repetitive, endless sequence of brief high-current pulses separated by relatively long periods of zero current (i.e., low duty cycle). A conceptual simplification with such waveforms is that then current excitation pulses in the two coils can alternate, with sufficient separation in time so that their mechanical responses can be considered independently.

With a sequence of brief injected current pulses, each injected current pulse can be considered as performing one discrete measurement of the error between the field as measured by the induced voltage integrator and the field as determined by the mechanical response to torque. The sequence of these measurements can then be analyzed using the mathematical tools developed for sampled data control systems. With proper calibration the continuous error "signal" is only caused by the drift characteristics of the electronic integrators, and will not have any significant components except at extremely low frequencies. It thus can be completely reconstructed from the sampled measurement sequence and used to completely cancel out integrator drift.

The rotor assembly 20, coupled with linkages 24 and 26, form a spring-mass structure with a well defined mechanical resonance, with no significant process for swiftly damping vibrations. Therefore, each (finite-duration) current pulse should be specially shaped so as to avoid exciting any continuing resonant vibrations of the mechanical system, and to avoid measurement sensitivity to any preexisting resonant vibrations. If the injected current waveform includes internal time intervals when the current is held constant, it may also be useful to shape each current transition to avoid exciting resonant mechanical vibrations. A simplified analysis treats the magnetic field during the current injection pulse as a constant and represents the mechanical vibration by the following second order linear differential equation:

$$\frac{1}{\omega^2}\ddot{\theta} + \theta = u(t) \quad (13)$$

where u(t) is a normalized forcing torque (proportional to $I_z B_r$ or $I_r B_z$), $\theta(t)$ is the suitably scaled mechanical response as seen via the strain gauge sensor, and the constant parameter $\omega$ is the radian mechanical resonant frequency, which may be calculated from the moment of inertia of the rotor assembly, the distance from the axle to linkage 24, and the "spring constant" stiffness of linkage 24. Also, $\omega$ can be accurately measured by simply observing variations in strain gauge resistance during vibrations. The steady response $\theta(t)=1$ is consistent with $u(t)=1$, but so is the unsteady response $\theta(t)=1+a\sin(\omega t)+b\cos(\omega t)$ for arbitrary values of a and b. One possible transition between u=0 and u=1 that does not excite the resonance is the following:

$$u(t) = f(\omega t) = \begin{cases} 0 & \text{if } \omega t < 0 \\ 1/2(1 - \cos(3\omega t)) & \text{if } 0 \leq \omega t \leq \pi \\ 1 & \text{if } \pi < \omega t \end{cases} \quad (14)$$

With this current transition waveform shape, the normalized mechanical response is:

$$\theta(t) = g(\omega t) = \quad (15)$$
$$\begin{cases} 0 & \text{if } \omega t < 0 \\ \frac{1}{2} - \frac{9}{16}(1-\cos(\omega t)) + \frac{1}{16}\cos(3\omega t) & \text{if } 0 \leq \omega t \leq \pi \\ 1 & \text{if } \pi < \omega t \end{cases}$$

Clearly, this does not force any sustained oscillations. Invoking linearity, this result supports using the following full current pulse shape and expected mechanical response, which are plotted in FIG. 3.

TABLE 1

Figure 3:
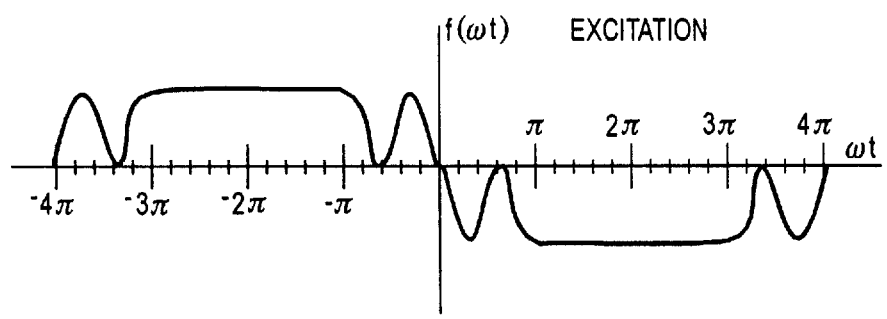
FIG. 3 shows a suitable shaped current pulse waveform and its expected mechanical response.
Figure 3:
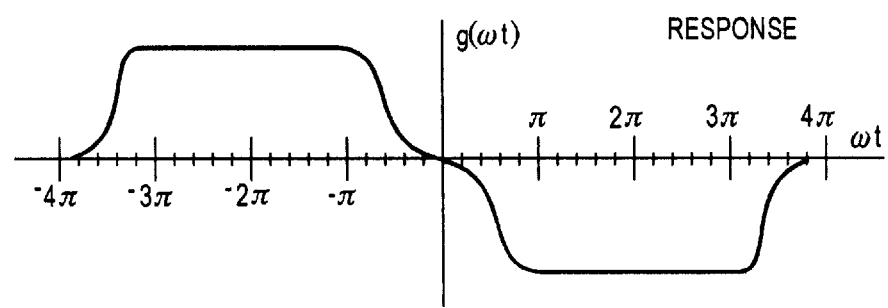
Figure 4A:
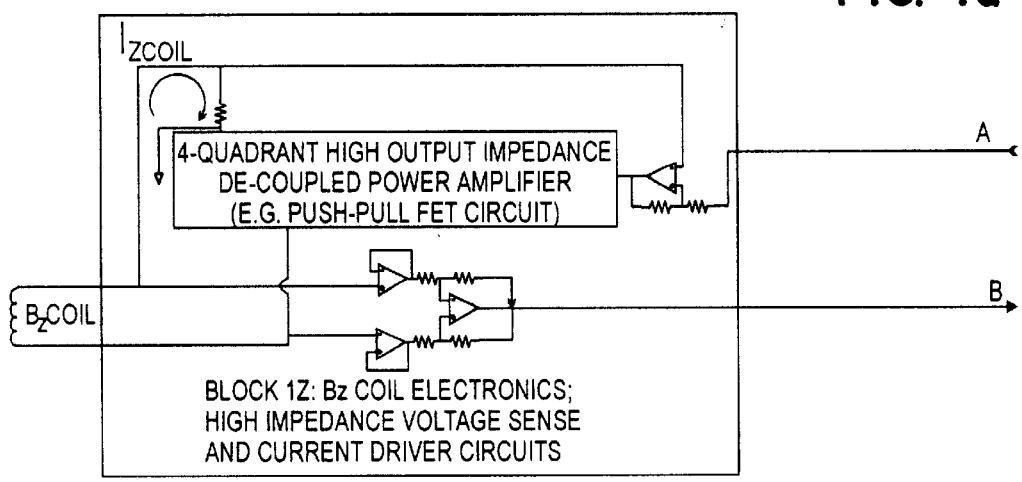
FIG. 4 shows a block diagram of electronic signal processing in accordance with the present invention.
Figure 4A:
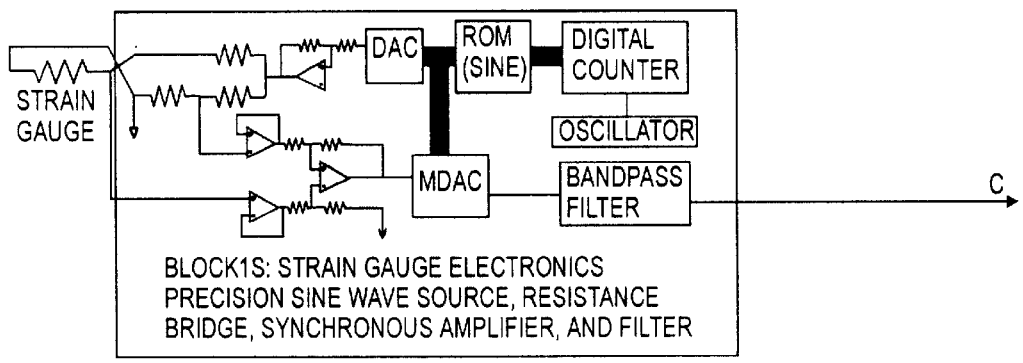
Figure 4A:
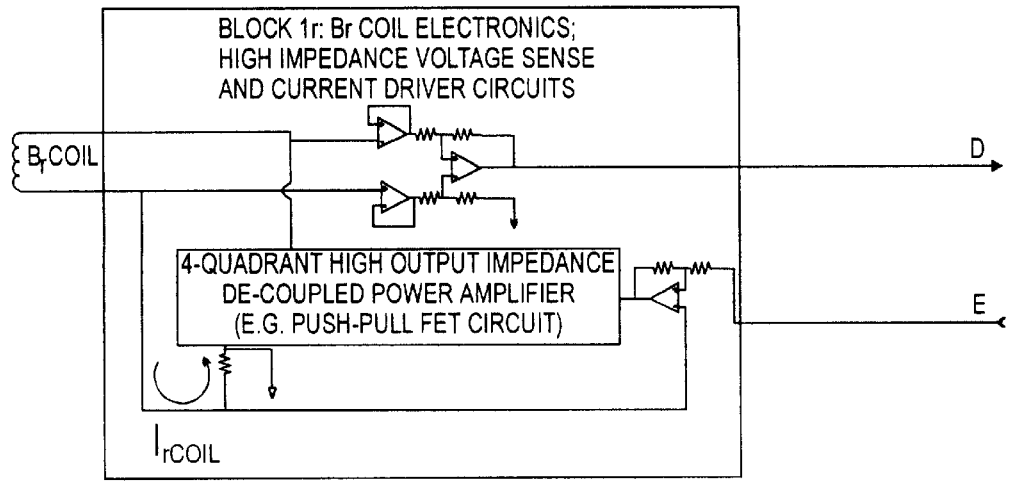
Figure 4B:
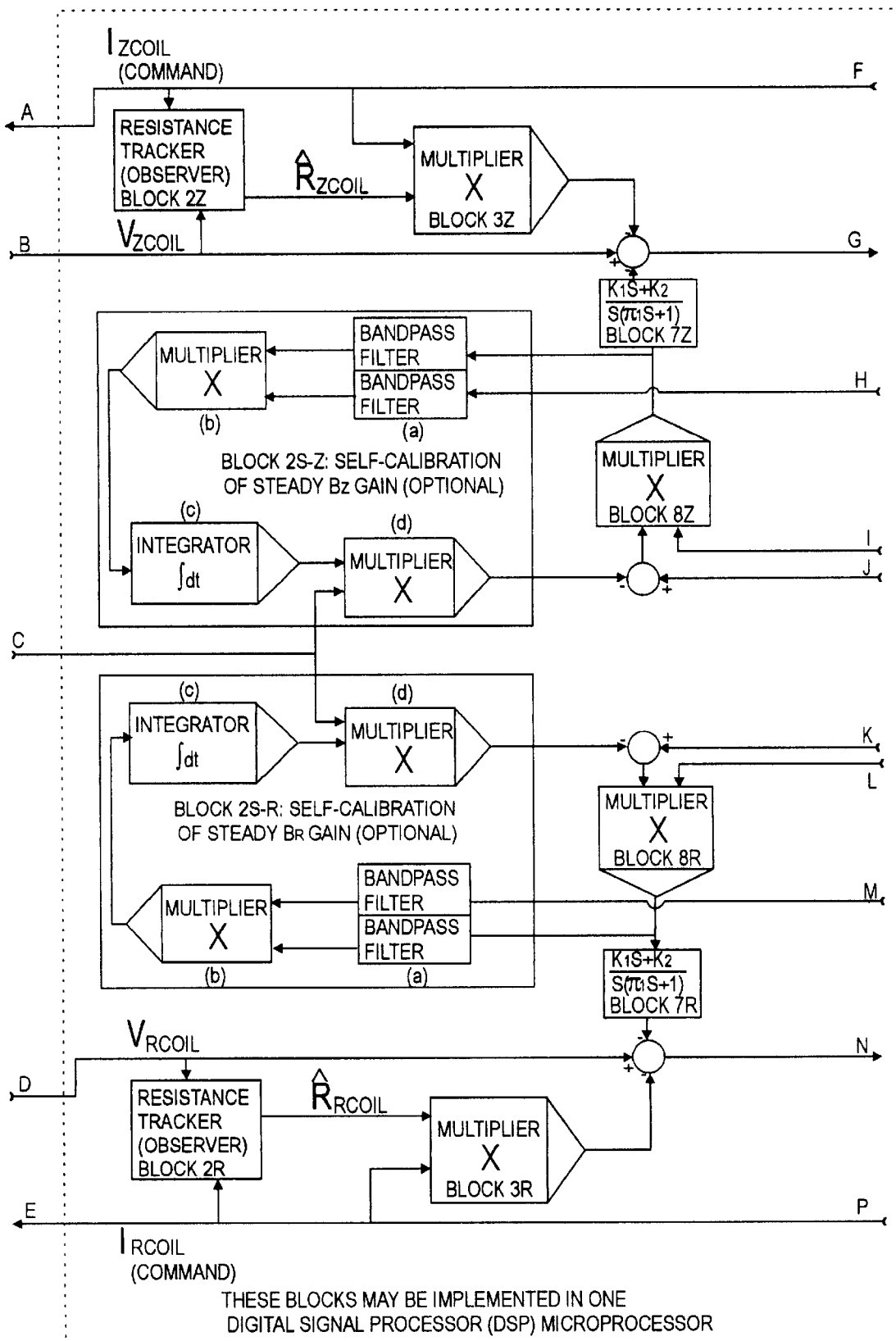
Figure 4C:
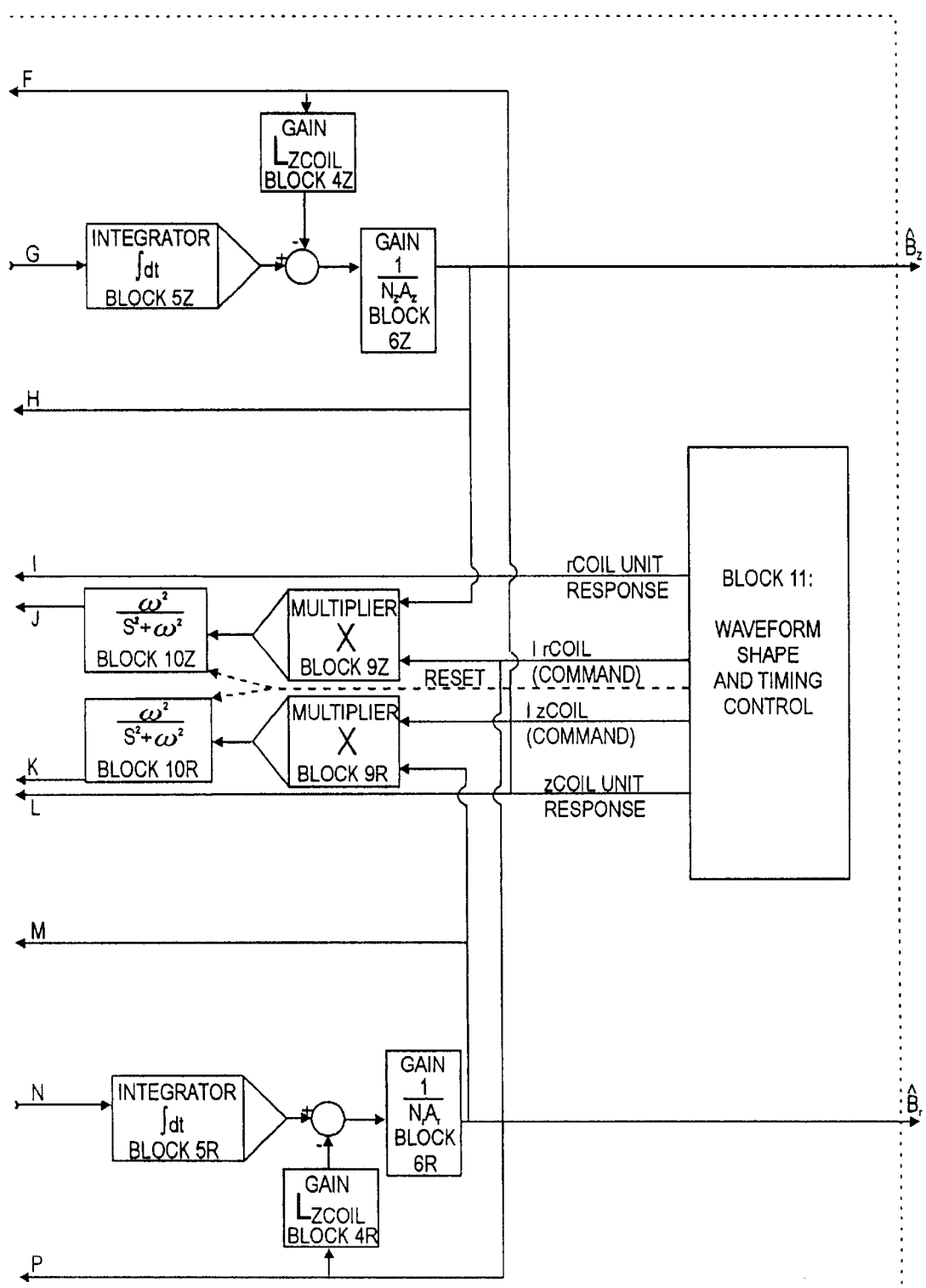

A Suitable Shaped Current Pulse Waveform (See FIG. 3)

| Normalized Time, $\omega t$ (1 mech. oscillation period = $2\pi$) | normalized current shape $u(t) = f(\omega t)$ | normalized response $\theta(t) = g(\omega t)$ |
|---|---|---|
| $\omega t \leq -4\pi$ | 0 | 0 |
| $-4\pi \leq \omega t \leq -3\pi$ | ½(1−cos(3ωt)) | ½−9/16cos(ωt) + 1/16cos(3ωt) |
| $-3\pi \leq \omega t \leq -\pi$ | 1 | 1 |
| $-\pi \leq \omega t \leq 0$ | ½(1−cos(3ωt)) | ½−9/16cos(ωt) + 1/16cos(3ωt) |
| $0 \leq \omega t \leq \pi$ | −½(1−cos(3ωt)) | −½−9/16cos(ωt) + 1/16cos(3ωt) |
| $\pi \leq \omega t \leq 3\pi$ | −1 | −1 |
| $3\pi \leq \omega t \leq 4\pi$ | −½(1−cos(3ωt)) | −½−9/16cos(ωt) + 1/16cos(3ωt) |
| $4\pi \leq \omega t$ | 0 | 0 |

Although this mechanical response $\theta(t)=g(\omega t)$ would occur if the assembly were not vibrating prior to a current pulse, any preexisting vibrations would continue undiminished throughout the pulse in addition to the $g(\omega t)$ response given in Table 1. But this particular pulse waveform shape has another useful property. A well-known general way to effectively optimize signal-to-noise ratio is to integrate the product of an expected signal response and the actually measured signal response (sometimes called a "cross-correlation" or "inner product"). For this particular pulse shape $f(\omega t)$, the response obeys the following equation:

$$\int_{-4\pi}^{4\pi} g(\omega t)[a\sin(\omega t) + b\cos(\omega t)]d(\omega t) = 0 \quad (16)$$

for any values of a and b. Thus, the signal processing method to determine magnetic field from strain gauge measurements using the Table 1 waveform is not affected by preexisting vibrations. Additional properties of this waveform include the fact that it and its first derivative are both continuous, so the required injection voltage varies smoothly as well. Also, the fact that the time integral of the current pulse waveform is itself identically zero improves electronic signal processing effectiveness in several other ways.

It should be noted that the Table 1 waveform is not unique and should therefore be considered as simply illustrating a method of this invention. Its properties are shared by any pulse shape (u(t)=BI(t)) which:

(a) has a continuous first derivative, (b) is antisymmetric (I(t)=−I(−t)), (c) whose finite duration is an integer multiple of the mechanical oscillation period (i.e., I(t)=0 for t>T where $\omega T/\pi$ is a positive integer), and (d) satisfies the following integral equation $$\int_0^T I(t)\sin(\omega t)dt = 0 \tag{17}$$

any other waveform shapes can also be constructed possessing all of these properties but having additional signal processing benefits as well.

Description of Signal Processing Portions of the Apparatus

FIG. 4 is a block diagram of the signal processing electronics for a $B_rB_z$ coil pair and its strain gauge. FIG. 4 is intended to illustrate a method of this invention. Actual electronic signal processing apparati used in the practice of this invention may differ in the implementation of each block shown in FIG. 4. The signal processing can be entirely implemented in analog circuitry, or alternatively can be implemented as a hybrid combination of analog circuitry, digital circuitry, and a microprocessor (or digital signal processor or microcontroller) with appropriate ROM-based "firmware".

Connected to each $B_r$ or $B_z$ coil is a necessarily analog electronic circuit (blocks 1Z and 1R respectively, in FIG. 4) which includes a high output impedance amplifier to inject the current pulse waveforms and a high impedance voltage sense circuit. The circuit injecting excitation current into each $B_r$ or $B_z$ coil electrically must approximate an ideal controllable current source as close as possible, i.e., it must be a very high impedance driver designed to have the maximum practical value of small signal impedance. (This can be achieved via standard analog circuit practice, e.g., by using an operational amplifier with appropriate "current pump" feedback, by using a FET circuit, or by a combination of these and perhaps other circuits.) Thus, the current injection circuit does not appreciably "load" the coil voltage induced by time varying flux linkages whenever the external magnetic field changes. The voltage sense circuit also follows standard analog circuit practice (sometimes used for conventional $B_r$ $B_z$ coils), e.g., using operational amplifiers in a high impedance voltage follower configuration.

In order to subtract and thus cancel the effects of the injected coil current pulse waveform from the induced voltage integration, it is necessary to use circuit parameters to estimate those effects. Each coil circuit's electrical inductance value can be expected to remain constant to a high degree of accuracy (since it only depends on geometry). But constant resistance wire has excessive electrical resistance and so is not practical for this application. Copper wire has a resistance temperature coefficient near 0.4%/°C. Therefore, the coil circuit's electrical resistance will change with temperature of the conductor, and cannot be assumed to remain constant.

High pulsed currents in the coils are needed to maximize torque measurement sensitivity, but the coil wire size must be of small cross section to minimize space. Wire temperature will change rapidly due to $I^2R$ heating from injected current pulse waveforms, will change at intermediate rates as the heated conductors cool down toward the ambient, and will also change slowly due to (unpredictable) changes in ambient temperature. Since the $B_rB_z$ electronics monitor coil voltage and inject known current, they will implement an active parameter estimation scheme to track changes in circuit resistance based on real time circuit measurements. (These are the "resistance tracker (observer)" blocks in FIG. 4.) The resulting accurate real time estimates of coil resistance, $R_{rCoil}$ and $R_{zcoil}$, will be used by the $B_rB_z$ electronics to continuously estimate the injection voltage. (Note: the "hat" symbol appearing above each variable name denotes that the variable is an estimate based on real time measurements, rather than the precise physical value.)

There are several possibilities for the resistance parameter estimation scheme; all use the equation:

$$I^2R = VI - \dot{L}II - I\phi_{ext} \tag{18}$$

where V, I, and I' are signals "known" by the $B_rB_z$ electronics, since V is measured in real time and I is both measured and controlled, and where L is a constant parameter known by the electronics based on initial calibration measurements. Although the external flux changes $\phi_{ext}$ are not known and may be nonzero, they are not causally related to the excitation currents injected into these coils. The injected current, I, is pulsed "ac" with a zero DC component. The product $I\phi_{ext}$ is therefore expected to have an average value of zero, and thus $$\overline{I^2R} = \overline{(V-LI)I} \tag{19}$$

where the overbar denotes averaging over some suitable long time window. This window should be chosen long enough so that $I\phi_{ext}$ can be neglected, but short enough to follow slow changes in resistance caused by background ambient temperature variations. If the "ratcheted-steady-state" resistance remains roughly constant during each injected current pulse, the proper average resistance value can be estimated from real time measurements via the equation $$\hat{R} = \frac{\overline{(V-L\dot{I})I}}{\overline{I^2}} \tag{20}$$

Figure 5A:
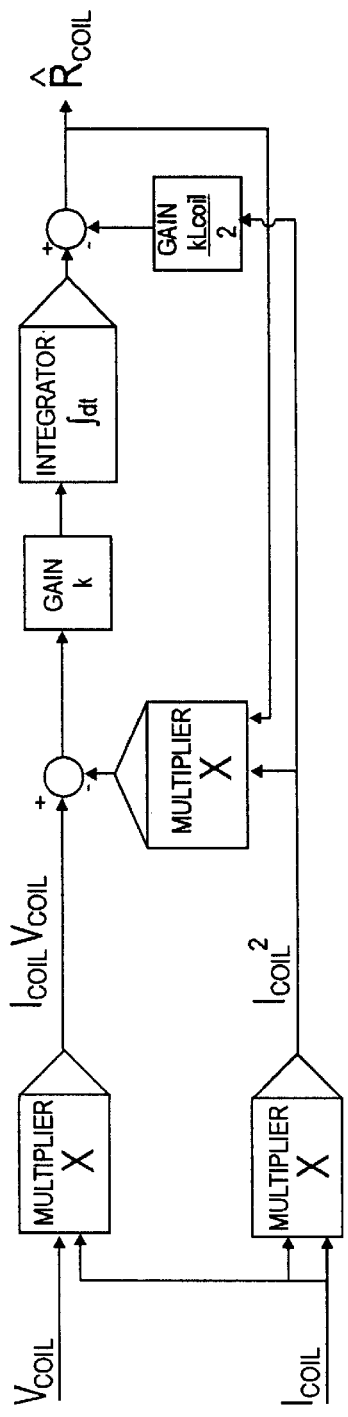
FIG. 5a shows resistance modeled as an unknown constant; (not varying during pulse) and, FIG. 5b shows resistance with simple (exponential) thermal model (varying during pulse).

This can be achieved via the signal processing shown in FIG. 5a, which implement the "observer" equations:

$$\dot{x} = k(VI - \hat{R}I^2) \tag{21}$$

$$\hat{R} = x - \frac{kL}{2} I^2 \tag{22}$$

where x is an internal state variable of the observer, k is an internal gain value, and R is the estimated resistance which is output by the observer. By combining these equations with the previous ones, the error between the estimated resistance and a constant actual resistance evolves according to the equation:

$$\frac{d}{dt}(R - \hat{R}) = -kI^2(R - \hat{R}) - kI\dot{\phi}_{ext} \tag{23}$$

For any positive gain, k, this error asymptotically approaches zero (assuming that the average $I\phi_{ext}$ remains near zero). The effective averaging window time duration is selected via the adjustable value used for the internal gain, k.

If, instead, resistance does vary significantly over each injected current pulse, then a more complicated parameter estimation scheme should be used. One such scheme is discussed in the following development, and appears in the signal processing scheme shown in FIG. 5b. The resistance is modeled as $$R = R_0(1 + \alpha T) \tag{24}$$

where $R_0$ is the coil resistance at 0° C., α is the temperature coefficient, and T is the conductor temperature. Heat in the coil winding is assumed to obey the following process:

$$C \frac{dT}{dt} = I^2 R - h(T - T_A) \tag{25}$$

where C is the heat capacity of the wire in the winding, h is an effective heat transfer coefficient, and $T_A$ is an effective ambient temperature to which heat is transferred from the winding. The parameters $R_0$, C, and h can be estimated from the $B_r B_z$ sensor construction details, and can also be calibrated by directly measuring how the resistance changes with time when $\phi_{ext}$ is known to be zero. Thus they can be assumed known and the $B_r B_z$ electronics can use them. The variable $T_A$ is assumed to have a unknown value which varies so slowly that it can be considered constant over any observer averaging period.

This equation can be rewritten by combining the resistance variation equation and defining the unknown constant resistance at ambient temperature, $$R_A = R_0(1 + \alpha T_A) \tag{26}$$

the known exponential cooldown time constant $$\tau = \frac{C}{h} \tag{27}$$

and the known heatup constant $$W = \frac{C}{\alpha R_0} \tag{28}$$

which is the value of pulsed amp$^2$sec necessary to adiabatically multiply the resistance by e=2.71828. Then the resistance is expected to change dynamically according to the following equation:

$$\frac{dR}{dT} = -\frac{1}{\tau}(R - R_A) + \frac{1}{W} I^2 R \tag{29}$$

Figure 5B:
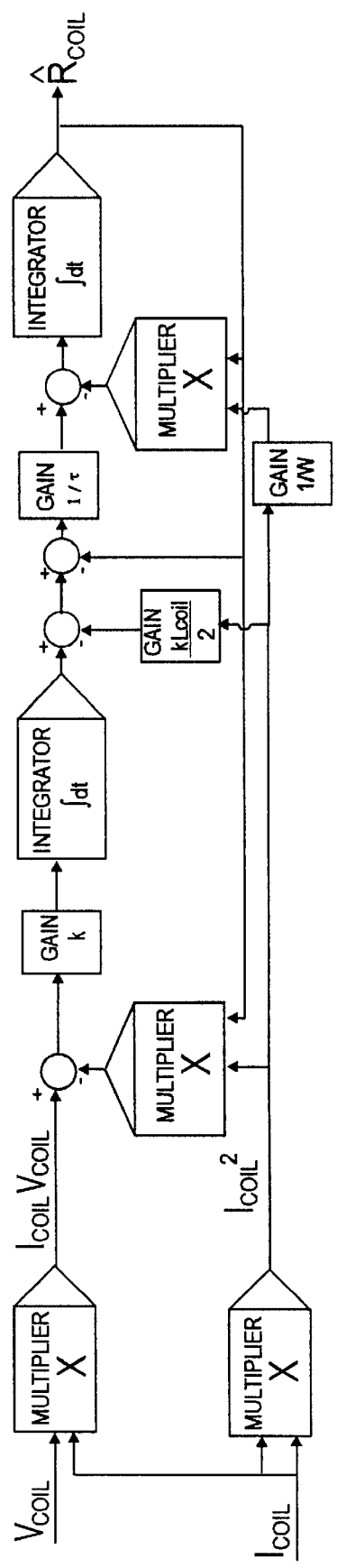

An "observer" system to estimate R from real time measurements can be implemented by solving the following system of real-time differential equations, as shown in FIG. 5b:

$$\begin{aligned}
\dot{x}_1 &= \frac{I^2}{W} x_1 + \frac{1}{\tau}\left(x_2 - x_1 - \frac{kI}{2} I^2\right) \\
\dot{x}_2 &= k(VI - I^2 x_1) \\
\dot{R} &= x_1
\end{aligned} \tag{30}$$

where $x_1$ and $x_1$ are internal state variables of the observer, R is the observer's output (estimate of coil resistance), and k is an internal gain of the observer. It can be shown that even though resistance varies rapidly, the error between the time-varying estimated and actual resistance approaches zero slowly and asymptotically assuming, again, that $I\phi_{ext} \approx 0$.

Regardless of which method is used for the resistance estimation algorithm of blocks 2R & 2Z in FIG. 4, the electronics multiplies the estimated resistance by the coil current in blocks 3R & 3Z to calculate a voltage drop, which is subtracted from the measured $B_r$ or $B_z$ coil voltage. With a steady-state correction signal added (from blocks 7R and 7G in FIG. 4), the result is integrated in a fashion similar to conventional practice for short-pulse tokamaks except that any integrator drift is canceled by the steady-state correction. The inductive effect is subtracted after the integrator, and the result is proportional to the magnetic field, for unlimited time durations.

The estimated magnetic field signals output from FIG. 4, $B_r$ and $B_z$, are multiplied in blocks 9R and 9Z by the injected current signals in order to calculate expected time-varying torques on the rotor assembly. Blocks 10R and 10Z implement linear transfer functions which solve Equation (13), thus calculating the expected time-varying mechanical response to the calculated torque pulses.

Blocks 2S-R and 2S-Z in FIG. 4 behave simply as gain factors, each of which multiplies (in subblock (d)) the strain variation signal from Block 1S by the proper gain constant (i.e., the output of subblock (c)) before the result is subtracted from the calculated mechanical response (i.e., from the output of block 10R or 10Z). In fact, blocks 2S-R and 2S-Z could be replaced by much simpler constant gain blocks, provided that their gain values were very precisely calibrated. The purpose of these gain factors is to exactly match the calibration of the induced voltage method with that of the torque method, and it is crucial to this invention that they be properly matched. The self-calibration method by which the optional subblocks of blocks 2S-R and 2S-Z automatically determine the proper gain values is discussed further below.

If the magnetic field were to vary significantly during a finite-duration current excitation pulse, the actual physical torque pulse applied to the rotor assembly could have a completely different shape from the torque pulse shape that would result if magnetic field were constant (e.g. f($\omega$t) in the case of Table 1 & FIG. 3). The calculated torque pulse output from FIG. 4 block 9R or 9Z would also have a similarly distorted shape.

However, the error between the estimated $B_r$, or $B_z$ output signals and the actual $B_r$ or $B_z$ values will not vary during a current excitation pulse, since the induced voltage method driving block 5R and 5Z integrators is quite capable of accurately following field variations on the pulse duration time scale. It logically follows that the error between the torque output signal from FIG. 9R or 9Z and the actual physical torque operating the rotor assembly will automatically have a pulse shape time variation matching that of the current excitation waveform, with no sensitivity whatsoever to any magnetic field variations that may occur during the pulse. Furthermore, the linearity of Equation (13) guarantees that the difference between the actual mechanical response and the calculated response (from blocks 10R or 10Z) will also be unaffected by any distortion of the torque pulse waveform caused by such field variations.

FIG. 4 subtracts the outputs from blocks 2S-R and 2S-Z, which are proportional to the actual mechanical response, from the "expected mechanical responses" output from blocks 10R or 10Z, respectively. Assuming that blocks 2S-R and 2S-Z (or constant gain versions of them) do actually implement the proper gain values, then during any current excitation pulse the difference signal is the sum of any preexisting mechanical vibration (i.e., a function of the form (a sin(wt)+b cos(wt))) plus a function proportional to the product of the magnetic field error ("constant" during each pulse) with the unit mechanical response that would have resulted with constant unit magnetic field. This difference signal is then multiplied by the forced unit response, in FIG. 4 blocks 8R or 8Z.

The resulting output signals from blocks 8R and 8Z are each streams of brief bidirectional pulses; the net area of each pulse is proportional to the accumulated error in the associated field measurement. (For the case of Table 1 & FIG. 3, each output pulse from block 8R has the form of the following equation:

$$(\hat{B}_r - B_r) g_z^{2z}(\omega) + (a \sin(\omega t) + b \cos(\omega t)) g_z(\omega t) \tag{31}$$

and each output pulse from block 8Z has the form of the following equation:

$$(\hat{B}_z - B_{zB_z})g_r^2(\omega t) + (a \sin(\omega t) + b \cos(\omega t))g_r(\omega t) \quad (32)$$

Since excitation current pulse shapes satisfy equation (16), one integration removes the effect of preexisting mechanical vibrations. The pole at zero frequency in the transfer function of blocks 7R and 7Z provides that integration function, and in addition forces the steady-state error to zero as the only system equilibrium condition. The other terms in the transfer function of blocks 7R and 7Z are provided in order to stabilize the feedback loop formed by blocks 5, 6, 9, 10, 8, and 7 (R or Z), so that the equilibrium is a stable one and unlimited time duration accuracy results.

The exact strain gauge electronics shown in FIG. 4 is not required for the practice of this invention. However, any strain gauge electronics used must provide an output signal which has a very precise and repeatable calibration versus strain variations while attenuating any electrical noise, in order to accurately measure the mechanical response to torque pulses. As shown in block 1S, a high frequency oscillator (e.g.12.8 MHZ) and digital counter (e.g. 8 bits/256 states) drive a Read-Only-Memory (ROM) whose data contents are binary representations of the sine function. The ROM's output drives a Digital-to-Analog-Converter (DAC) which produces a continuous sinusoidal signal of extremely precise amplitude and known frequency (e.g.50 kHz). This signal excites a resistive bridge circuit containing the strain gauge as one its four resistors. The returned difference voltage from the bridge is multiplied by the exciting signal in a Multiplying-Digital -to-Analog-Converter (MDAC) which provides an exceptionally precise analog product if one factor is available in digital form. This DAC/MDAC configuration thus forms a high precision synchronous amplifier. The resulting zero frequency (dc) and low frequency components of the product are directly proportional to the signed resistive imbalance in the bridge, and thus to the strain variation. A filter removes the high frequency components of this signal (which are at twice the excitation frequency). Because the bidirectional current excitation waveforms have a mean value of zero, the torque pulses have a mean value near zero and the mechanical strain response of interest also has mean value zero. Thus, the zero frequency (dc) component of the strain signal does not contain any useful information for determining magnetic field. The lowest frequencies of interest are simply the lowest frequencies in a Fourier decomposition of the current excitation pulses (e.g., of f($\omega$t) for the case of Table 1 & FIG. 3). In order to maximize dynamic range, the filter is therefore ac-coupled, and so is implemented as a bandpass filter.

The optional self-calibration scheme shown in blocks 2S-R and 2S-Z of FIG. 4 is based on the existence of an overlap in the signal frequency bands for which the induced-voltage and torque based magnetic field measurements can be used reliably. As stated earlier, the time sequence measurements of the error between the methods can be analyzed using the mathematical tools developed for sampled data control systems. The Nyquist criterion asserts that as long as the continuous error history of the output field measurements is band-limited to not exceed half the sample frequency, it can be completely reconstructed from the sequence of discrete samples. Thus, the signals output from blocks 8R and 8Z of FIG. 4 can accurately represent the measurement error for frequencies from zero up to half the current excitation pulse repetition frequency. The induced voltage method is not accurate at zero frequency or at extremely low frequencies, but can be relied on as accurate for signals within a wide frequency band, typically extending up to several kilohertz and down to a lower limit depending on the interplay between accuracy requirements and the electronic integrator technology employed. Thus, as long as the current pulse repetition frequency is well above twice the lowest frequency at which electronic integrator performance is accurate, there is an overlap band of frequencies in which both measurement methods are valid and accurate.

Magnetic field signal variations at frequencies within the validity overlap frequency band must have identical amplitudes as measured by either of the two methods. Stated equivalently, the Fourier frequency spectrum decomposition of the error signals output from blocks 8R and 8Z of FIG. 4 must have zero amplitude within the overlap frequency band. Subblock (a) of blocks 2S-R and 2S-Z each implement identical two-channel frequency-selective linear filters; each filter passes signals in this validity overlap band and strongly attenuates frequencies outside the band. In particular, these bandpass filters do not transmit the zero frequency (dc) and near-zero frequency components in the signal outputs from blocks 8R and 8Z which are used via blocks 7R and 7Z to cancel integrator drift in blocks 5R and 5Z.

If the mechanical response measurement signal from the strain gauge is multiplied by the correct value of gain in subblock (d) of blocks 2S-R or 2S-Z, the validity overlap frequency components of the error are then identically zero. However, if block 2S-R or 2S-Z implements the wrong value of gain, then the error signal output from block 8R or 8Z would be nonzero whenever magnetic field is nonzero, and the validity overlap frequency components of the error signal would vary in step with the validity overlap frequency components of the field variations themselves. Therefore, the validity overlap frequency components of the error and of the field variations are multiplied together in subblock (b) in order to form a gain correction signal. As long as actual field variations have nonzero spectral components within the validity overlap band, this gain correction signal will automatically be positive if the gain is too low and negative if the gain is too high. The gain value itself, which is the output from the integrator of subblock (c), is therefore automatically increased or decreased until the properly calibrated gain value is reached.

The speed of the automatic self-calibration process is proportional to the sum of the squares of the amplitudes of any magnetic field variation frequency components that are within the validity overlap frequency spectrum. It should be possible to entirely complete the automatic self-calibration during an initial plasma-free commissioning test in which poloidal field coil currents are varied, perhaps sinusoidally or even randomly, with large amplitude frequency components within the validity overlap frequency spectrum. It is expected that the gains (i.e., outputs from subblock (b)) will never change after the proper gain values are initially reached. Because the gains will not change after initial commissioning, it may be appropriate to implement blocks Ⓒ and (d) digitally. It may even be appropriate and cost effective to eliminate the optional self-calibrating feature altogether and replace it with a simple fixed-gain version of blocks 2S-R and 2S-Z and with complicated manual calibration test procedures to be employed during commissioning.

Repetitively at regular time intervals, block 11 synthesizes brief preprogrammed pulse waveforms for the coil current excitation (e.g., f($\omega$t) ) and for the forced unit mechanical response (e.g., g($\omega$t) ), alternating successive pulses between the $B_r$ and the $B_z$ coils. After each pulse is completed (i.e., after the pulse waveforms have returned to zero), it also resets the integrator functions which are inherent within the transfer functions of blocks 10R and 10Z. This reset function, which is harmless because of Equation (16), is done to positively avoid any possibility of exceeding the maximum dynamic range within blocks 10R and 10Z, which do not implement any internal damping of oscillations whatsoever.

As stated previously, the $B_r$, $B_z$ electronic signal processing of FIGS. 4 and 5 may be implemented in various ways involving different possible combinations of analog circuits, digital circuits, and/or digital computers. In all possible implementations, blocks 1R, 1S, and 1Z must contain analog circuitry in order to interface with the $B_r$ & $B_z$ coils and the strain gauge.

The analog/digital hybrid scheme depicted within block 1S seems to be the most practical implementation of the necessary precision sine wave source and synchronous amplifier if the operating frequency is of the order of magnitude of 50 kHz. No alternative purely analog implementation of block 1S promises as much gain stability. For instance, ±0.01% is readily available if a 12-bit DAC and MDAC pair is used. Furthermore, this scheme implements the bandpass filter in block 1S with an analog circuit, which is quite reasonable at the signal frequencies involved. Any microcomputer would be severely taxed if assigned to digitally implement the very high speed (but almost trivial) analog signal generation, multiplication, and filtering functions of block 1S.

On the other hand, the repetitive timing and preprogrammed signal waveform synthesis functions of Block 11 seem ideally suited for implementation in a microcomputer. It would be difficult to implement these functions with the necessary precision in purely analog circuitry.

If the microcomputer used to implement block 11 were a sufficiently fast Digital Signal Processor (DSP), it may be possible and economical to implement in its program all of the blocks of FIG. 4 except for blocks 1Z, 1S, and 1R. The DSP would be connected to blocks 1Z, 1S, and 1R through its ADC input and DAC output channels. An added advantage of this implementation is that the $B_r$ and $B_z$ output measurement signals from FIG. 4 signal would be available in purely digital form without any additional analog-to-digital conversion steps. This digital form is appropriate for use in modern computer-based real time plasma control systems, which must use the measurements for high speed reconstruction of the plasma's shape, position, and current parameters from the full set of $B_r$ and $B_z$ measurements.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described to best explain the principles of the invention and its practical application and thereby enable others skilled in the art to best utilize the invention in various embodiments and with various modifications as are suited to the particular use contemplated. It is intended that the scope of the invention be defined by the claims appended hereto.

The embodiments of the invention in which an exclusive property is claimed are defined as follows:

1. A method for extending the frequency spectrum of uniformly accurate localized magnetic field measurements, which in tokamak applications are conventionally based on magnetic induction principles, to also include accurate magnetic field measurements at all lower signal frequencies including zero Hertz, for long-term unlimited and steady-state operation, based on a hybrid combination of the two different magnetic field principles, induction and torque, the method comprising the steps of:

a) electronically synthesizing and injecting at high impedance, electrical current waveforms into wound air-coil inductive pickup electrical coils, to produce time-varying mechanical torques on the coils with torque magnitudes proportional to the magnetic field being measured, the coils being structurally restrained to prevent large rotations or other large motions, b) continuously measuring the mechanical torque effects through the time-varying signal from a resistive strain gauge sensor mounted on the structural restraint, c) continuously measuring the time-varying voltages from the inductive pickup coils, d) continuously calculating and subtracting out the voltage perturbations contributed by the high impedance injection of the known electrical current waveforms into the coil circuit's resistance and inductance, so that the resulting signals represent the purely inductive voltage that would have been induced in the pickup coils if no current had been injected into them, e) continuously calculating the measured magnetic field from the measured coil voltages and currents and the measured strain gauge resistance, using signal processing algorithms based on physical laws including Newton's law of inertia, Hooke's law for spring elasticity, electric circuit analysis principles, and the following induction and torque electromagnetic laws for an air-core coil:

$$V = \vec{S} \cdot \frac{d\vec{B}}{dt}$$

$$\vec{T} = I\vec{S} \times \vec{B}$$

where V is the coil voltage, I is the coil current, S is a geometric vector directed along the coil winding axis with $|S|=NA$ the number of coil winding turns times their enclosed area, and B is the magnetic field vector at the coil location which is being measured.

2. An apparatus to measure magnetic field with constant accuracy for unlimited time durations near a tokamak plasma, the tokamak being configured with respect to a cylindrical coordinate system having z, phi (toroidal) and r axes, comprising:

a) a pair of air core inductive magnetic field pickup coils at a measurement location near the plasma, with the coil symmetry axes oriented orthogonally to each other and to the toroidal direction, and having associated remotely located integrator circuits, b) a single rigid-body rotor assembly including an axle and the pair of air core inductive magnetic pickup coils wound on a common winding form so that they are concentrically arranged with their symmetry axes orthogonal to each other and to the axle, and with the axle oriented on the tokamak to point in the toroidal direction, c) two pivot support brackets for mounting the rotor assembly on a baseplate via its axle, the brackets preventing all motions of the rotor assembly except for rotation about its axle, d) a thin stiff spring located between the baseplate and the rotor assembly to oppose rotation of the rotor assembly about its axle, e) means to avoid buckling of the thin stiff spring, f) a resistive strain gauge mounted on the thin stiff spring, g) a remotely located electronic circuit continuously monitoring changes in the resistance of the resistive strain gauge, h) two remotely located electronic circuits connected to the pair of air core inductive magnetic pickup coils, the circuits simultaneously monitoring the coils' voltages and actively injecting preprogrammed current waveforms from a high impedance controllable current source, i) remotely located electronic signal processing equipment which synthesizes the preprogrammed current waveforms injected into the pair of air core inductive magnetic pickup coils, tracks changes in the coils' electrical resistances, and calculates the coil voltage perturbations resulting from injecting the known current waveforms into the coil circuits' known self-inductance and resistance, and synthesizes magnetic field measurement output signals from the combination of coil voltage measurements and strain gauge resistance variation measurements.

3. The apparatus of claim 2 wherein the axle of the rotor assembly is structurally mounted on pivot support brackets attached to the baseplate to allow rotation through small angles about its axis, but rotation or translation in directions other than about its axis is prevented.

4. The apparatus of claim 3 wherein the thin stiff spring is a thin strip of metal, having a cross-sectional area so that the maximum toroidal torque on the rotor assembly results in metal stress less than the metal's fatigue stress limit but large enough so that metal strain is capable of being easily measured.

5. The apparatus of claim 4 in which the means to avoid buckling of the thin stiff spring is a second spring adjusted to always cause tension in the first spring.

6. The apparatus of claim 4 in which the means to avoid buckling of the thin stiff spring includes providing a spring in a shape and material which is resistant to buckling.

7. The apparatus of claim 2 in which the remotely located signal processing equipment is implemented in analog electronic circuits, or digital electronic circuits, or in a digital computer including a digital signal processor (DSP) microprocessor or DSP computer.

8. The apparatus of claim 7 in which the automatic tracking of the coils' electrical resistances within the remotely located signal processing equipment is accomplished by real time solution of the following observer equations:

$$\dot{x} = k(VI - \hat{R}I^2)$$
$$\hat{R} = x - \frac{kL}{2} I^2$$

or alternatively by real time solution of the following observer equations:

$$\dot{x}_1 = \frac{I^2}{W} x_1 + \frac{1}{\tau}\left(x_2 - x_1 - \frac{kL}{2} I^2\right)$$
$$\dot{x}_2 = k(VI - I^2 x_1)$$
$$\hat{R} = x_1$$

where the symbols I and V denote continuous real time measurements of coil current and voltage, where the R symbol denotes the coil resistance as estimated by the observer, where the x symbols denote calculated variables internal to the observer, and where the remaining symbols denote constant parameter values.

9. The apparatus of claim 7 in which the synthesis of magnetic field output signals uniformly accurate for unlimited time durations from the combination of coil voltage measurements and strain gauge resistance measurements includes:

a) first signal processing means that synthesizes a periodic sequence of specially shaped pulse waveforms and, alternating successive pulses between the two air core inductive magnetic pickup coils, also causes each shaped current pulse to be injected into a coil from the associated high impedance controllable current source, thus creating a time-varying torque on the rotor assembly proportional to the magnetic field, so that strain gauge signal variations provide periodic magnetic field measurement information independent of the electronic integrator signals, b) second signal processing means that multiplies the measured change in strain gauge resistance by a calibrated gain factor in order to determine the torque associated with that strain change, c) third signal processing means for each of the two coils that calculates the time-integral of the sum of a correction signal plus the difference between the coil's measured voltage and the calculated voltage perturbation caused by injecting the known current pulse waveform into that coil circuit's known self-inductance and tracked resistance, the output signal resulting from this calculation being the measured magnetic field component along the symmetry axis of that coil, uniformly accurate for unlimited time durations, d) fourth signal processing means that calculates the expected torque on each coil by multiplying its injected current pulse waveform by the measured magnetic field component along the symmetry axis of the other coil, e) fifth signal processing means that applies the calculated torque pulse to a second order resonant filter transfer function with the Laplace Transform, $\omega^2/(S^2+\omega^2)$, whose resonant frequency, $\omega$, is chosen to match the mechanical vibration rotational resonant frequency of the combined rotor assembly and springs, thereby synthesizing at the filter's output the expected strain gauge response signal waveform, f) sixth signal processing means for each coil that subtracts the actual strain gauge response waveform from the expected strain gauge response waveform and then multiplies the resulting difference by a precalculated unit field response waveform in order to develop a pulsating error signal whose average value is positive if the measured magnetic field component is too positive as compared to the strain gauge measurements, and negative if the measured magnetic field component is too negative as compared to the strain gauge measurements, g) seventh signal processing means that filters the pulsating error signals to produce the integrator correction signal needed for the third signal processing means, with the filtering parameters chosen so that the steady-state magnetic field measurement error in the absence of signal noise is asymptotically driven to zero in a stable fashion.

10. The apparatus of claim 9 in which the calibrated gain factor used to determine the torque associated with a measured strain change, is automatically self-calibrated by the following signal processing means:

a) for each coil, two identical bandpass filters are provided to pass only those frequencies in the validity overlap band, i.e., frequencies with the property that magnetic field variations at those frequencies are accurately measured by both the magnetic induction and the magnetic torque methods as implemented in this device, b) for each coil, one of these bandpass filters operates on the third signal processing means, the measured magnetic field signal for that coil, while the other bandpass filter operates on the sixth signal processing means, the pulsating error signal for that coil, c) for each coil, the two bandpass filter output signals are multiplied by each other to generate a pulsating gain correction signal whose average value can be positive only if the calibrated gain factor is too low, and can be positive only if the calibrated gain factor is too high, d) the pulsating gain correction signal is time-integrated to produce the automatically self-calibrated gain factor.

11. The apparatus of claim 9 where the synthesized current waveforms applied to the two air core magnetic pickup coils are continuous sinusoidal signals which are simultaneously injected into both of the two coils, having two different frequencies, or having the same frequency but displaced in time to create a 90° phase difference between them.

* * * * *